(12) United States Patent
Bloch et al.

(10) Patent No.: US 6,608,777 B2
(45) Date of Patent: Aug. 19, 2003

(54) CIRCUIT CONFIGURATION FOR READING MEMORY ELEMENTS

(75) Inventors: Martin Bloch, Gröbenzell (DE); Carmen Thalmaier, Ulm (DE)

(73) Assignee: Infineon Technologies AG, Munich (DE)

( * ) Notice: Subject to any disclaimer, the term of this patent is extended or adjusted under 35 U.S.C. 154(b) by 32 days.

(21) Appl. No.: 10/015,718

(22) Filed: Dec. 13, 2001

(65) Prior Publication Data

US 2002/0114196 A1 Aug. 22, 2002

(30) Foreign Application Priority Data

Dec. 13, 2000 (DE) .......................................... 100 62 124

(51) Int. Cl.[7] .............................................. G11C 16/06
(52) U.S. Cl. ................. 365/185.21; 365/185.2
(58) Field of Search ........................ 365/185.21, 185.2, 365/185.01, 189.07

(56) References Cited

U.S. PATENT DOCUMENTS 5,444,656 A    8/1995   Bauer et al.
5,835,412 A  * 11/1998  Tran ...................... 365/185.21
5,973,959 A  * 10/1999  Gerna et al. ........... 365/185.03

* cited by examiner

Primary Examiner—Hoai Ho
(74) Attorney, Agent, or Firm—Lawrence A. Greenberg; Werner H. Stemer; Ralph E. Locher

(57) ABSTRACT

A circuit configuration for measuring or calibrating current of components in memory elements, preferably, EPROM or EEPROM memory elements, includes a memory cell field, a reference cell field, a current comparator, a digital-analog converter receiving a digital signal having digital values and outputting predetermined current values based upon receiving corresponding ones of the digital values, a first switch having an output connected to a first input of the current comparator, a first input connected to the memory cell field, and a second input connected to the reference cell field, and a second switch having an output connected to a second input of the current comparator, a first input connected to the reference cell field, and a second input connected to the digital-analog converter. The second switch can have a third input to be connected to an external current source.

8 Claims, 1 Drawing Sheet

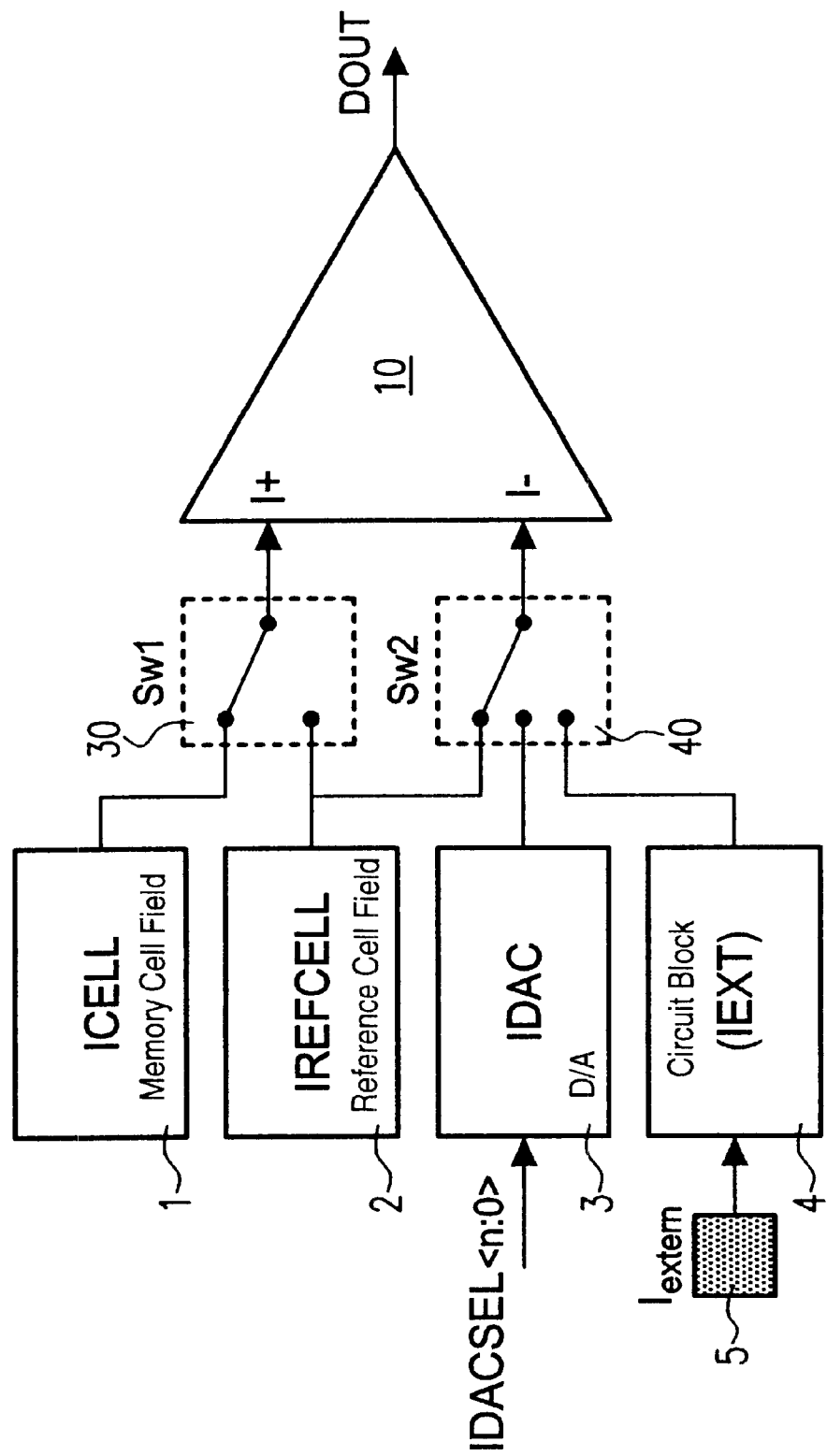

CIRCUIT CONFIGURATION FOR READING MEMORY ELEMENTS

BACKGROUND OF THE INVENTION

Field of the Invention

The invention relates to a circuit configuration for reading memory cells of memory elements and/or for measuring or calibrating current of components in memory elements. In particular, the invention relates to the field of EPROM or EEPROM elements.

In the art of memory elements, erasable programmable ROM memories such as EPROMs (Erasable Programmable ROMs) and EEPROMs (Electrically Erasable Programmable ROMs) have existed for a long time. In these ROMs, the programmable elements are formed by MOS transistors with a floating, i.e., electrically insulated, polysilicon gate, which is charged by the tunnel current flowing through a thin oxide layer given high field intensities. In the programming operation, a relatively high gate voltage is applied, whereas in the read operation a lower read voltage, which is merely above the threshold voltage of the MOS transistor, is applied. In the EEPROM memory elements that are customarily used, the read voltage is typically 2.4 V. The memory contents of the EEPROM cells are read by evaluating the current, i.e., the transistor current that flows given an applied gate voltage of 2.4 V is evaluated. Such is accomplished by feeding the transistor current to the positive input of a current comparator while feeding a reference current to the negative input. In these types of memory structures, whose cells are evaluated by current evaluation, reference current sources are required accordingly.

An external access to the overall system is usually required for determining and calibrating the current-sensitive components, i.e., primarily the reference cell field serving as the reference current source. The access is provided by connecting particular internal lines such as bit lines or reference lines to external pads with switches in the form of transmission gates. The measuring of currents in the overall system is then accomplished using external current measuring devices or indirectly using voltage measuring devices and a previously determined conversion factor. The disadvantage of such a technique is that, in the case of closed systems such as chip cards, it is impossible to implement the described form and manner of external access.

SUMMARY OF THE INVENTION

It is accordingly an object of the invention to provide a circuit configuration for reading memory elements and for measuring or calibrating the current of components in memory elements, particularly EPROM or EEPROM memory elements, that overcomes the hereinafore-mentioned disadvantages of the heretofore-known devices of this general type and with which it is possible to measure or calibrate the current in a simple and universally applicable and efficient fashion regardless of the system configuration, i.e., the utilization of a closed or open system. In particular, the invention makes possible to measure or calibrate current for closed systems such as chip cards in a simple fashion. Preferably, the components are in EPROM or EEPROM memory elements.

With the foregoing and other objects in view, there is provided, in accordance with the invention, a circuit configuration for one of measuring and calibrating current of components in memory elements, including a memory cell field, a reference cell field, a current comparator having first and second inputs, a digital-analog converter receiving a digital signal having digital values and outputting predetermined current values based upon receiving corresponding ones of the digital values, a first switch having an output connected to the first input of the current comparator, a first input connected to the memory cell field, and a second input connected to the reference cell field; and a second switch having an output connected to the second input of the current comparator, a first input connected to the reference cell field, and a second input connected to the digital-analog converter.

An essential idea of the invention is found in utilizing a digital-analog converter that is connected in a specific fashion to the components on the memory element, i.e., the memory cell field, the reference cell field constituting a reference current source, and the current comparator. The digital-analog converter is configured for setting a plurality of prescribed current values upon the inputting of corresponding digital values.

The inventive circuit configuration makes possible a solution for determining the precise cell current in an optimal test time without additional external measuring devices and is, thus, especially well suited to closed systems such as chip cards. The described circuit configuration additionally makes possible a precise object programming of memory cells without an external reference current and also can be utilized in closed systems such as chip cards in this respect.

However, if so desired, in accordance with a concomitant feature of the invention, the second switch includes a third input for connecting an external current source. Such an option should be used primarily or exclusively in open systems but not in closed systems, such as chip cards. When used in open systems, the option optimizes the test time.

The circuit configuration according to the invention enables the precise determination of memory cell and reference cell currents on chip without external measuring devices with the aid of the digital-analog converter that is integrated into the circuit configuration. In a memory element such as an EPROM or EEPROM memory, the circuit configuration according to the invention is disposed on a common substrate with the memory cell field, the reference cell field constituting the reference current source, and the current comparator.

Other features that are considered as characteristic for the invention are set forth in the appended claims.

Although the invention is illustrated and described herein as embodied in a circuit configuration for reading memory elements, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWING

The FIGURE is a block and schematic circuit diagram of a circuit configuration according to the invention.

DESCRIPTION OF THE PREFERRED EMBODIMENTS

A single exemplifying embodiment of the inventive circuit configuration will now be described with reference to the FIGURE of the drawing.

The circuit configuration includes a memory cell field 1, which may be the memory cell field of an EEPROM memory element. The memory cell field 1 is connected to a first input of a first switch (Sw1) 30. The output of the switch 30 is coupled with the positive input of a current comparator 10. In a read operation, a memory cell in the memory cell field 1 is selected and delivers a read current ICELL, which flows to the output of the memory cell field 1 over the bit line.

The circuit configuration also includes a reference cell field 2, which may form a reference current source in conventional fashion. To read a memory field, a comparison to a reference memory field with identical cell architecture is usually performed for reasons of symmetry. Therefore, it is necessary to program the reference cells to a particular reference current IREFCELL. The reference cell field 2 is connected to the second input of the first switch 30.

The first switch 30 is capable of two positions, in which it is connected either to the first or second input. The reference cell field 2 is also connected to a first input of a second switch (Sw2) 40. The output of the switch 40 is coupled with the negative input of the current comparator 10.

The circuit configuration also includes a digital-analog converter 3 that is connected to a second input of the second switch 40. The digital-analog converter converts a particular supplied digital value IDACSEL<n:0> into a current IDAC. The quantity "n" determines the desired resolution of the current range that can be generated by the digital-analog converter 3.

As an additional optional component, the circuit configuration contains a circuit block 4 that allows a direct access of the memory element by an external current source, this being possible in open memory systems. The external current source delivers a current IEXT that is fed to a third input of the second switch 40.

The second switch 40 is capable of three positions, in which the output is connected either to the first, second, or third input.

The current comparator 10, which can simultaneously function as a read amplifier for the currents that are read from the memory cells, compares the currents at its inputs I+ and I− and delivers a digital output signal DOUT. The signal DOUT assumes the value 1 when I+>I− and the value 0 when I+=I−. Such a current comparator is preferably used as a read amplifier in memory systems such as EEPROM memory elements and is usually already provided there.

In the circuit configuration according to the invention, the following states are made available by the switches 30 and 40.

The first state involves the programming of the reference cells to a precise target value without an external reference current. The digital-analog converter 3 is set to the target value with IDACSEL<n:0>, and the reference cells of the reference cell field 2 are programmed until the output signal of the current comparator 10 indicates that the desired programming of a memory cell has been completed. The first switch 30 is connected to the reference cell field 2, and the second switch 40 is connected to the digital-analog converter 3.

In the second state, a memory field is read at the same time as a reference memory field. Such a state, thus, represents a standard access. The memory cells in the memory cell field 1 are compared to the target value programmed in the reference cell field 2. The switch 30 is connected on the input side to the memory cell field 1, and the switch 40 is connected on the input side to the reference cell field 2.

In the third state, a read operation is performed in the memory cell field 1 by a comparison with the aid of the digital-analog converter 3 with the aim of a precise cell current determination. To optimize the test time, the digital-analog converter 3 is used to perform a precise cell current measurement. To accomplish the measurement, the digital-analog converter 3 is set to specified current values with a digital value IDACSEL by the method described below, and, thus, the current in the memory cell field 1 is evaluated by the current comparator. The first switch 30 therein is connected to the memory cell field 1, whereas the second switch is connected to the digital-analog converter 3.

In the method for measuring current of the memory cells of the memory cell field 1 with the aid of the digital-analog converter 3, the following digital values IDACSEL are set:

$$IDACSEL_0 = \frac{n}{2}$$

$$IDACSEL_{N+1} = \begin{Bmatrix} DOUT = 1 \\ DOUT = 0 \end{Bmatrix} \rightarrow \begin{Bmatrix} IDACSEL_N * 1/2 \\ IDACSEL_N * 3/2 \end{Bmatrix}$$

the maximum cycle number in this method is:

$$C_{\max} = \frac{\log(n)}{\log(2)} + 1$$

We claim:

1. A circuit configuration for one of measuring and calibrating current of components in memory elements, comprising:
   a memory cell field;
   a reference cell field;
   a current comparator having first and second inputs;
   a digital-analog converter receiving a digital signal having digital values and outputting predetermined current values based upon receiving corresponding ones of said digital values;
   a first switch having:
     an output connected to said first input of said current comparator;
     a first input connected to said memory cell field; and
     a second input connected to said reference cell field;
   a second switch having:
     an output connected to said second input of said current comparator; and
     a first input connected to said reference cell field;
     a second input connected to said digital-analog converter.

2. The circuit configuration according to claim 1, wherein said second switch has a third input to be connected to an external current source.

3. The circuit configuration according to claim 1, wherein the components are in EPROM memory elements.

4. The circuit configuration according to claim 1, wherein the components are in EEPROM memory elements.

5. A memory element, comprising:
   a substrate;
   a memory cell field disposed on said substrate; and
   a circuit configuration disposed on said substrate with said memory cell field, said circuit configuration having:
     a reference cell field;
     a current comparator having first and second inputs;
     a digital-analog converter receiving a digital signal having digital values and outputting predetermined current values based upon receiving corresponding ones of said digital values;
a first switch having:
  an output connected to said first input of said current comparator;
  a first input connected to said memory cell field; and
  a second input connected to said reference cell field;
a second switch having:
  an output connected to said second input of said current comparator; and
  a first input connected to said reference cell field;
  a second input connected to said digital-analog converter.

6. The circuit configuration according to claim 5, wherein said second switch has a third input to be connected to an external current source.

7. The circuit configuration according to claim 5, wherein the memory element is an EPROM memory element.

8. The circuit configuration according to claim 5, wherein the memory element is an EEPROM memory element.

* * * * *